United States Patent
Wei

Patent Number: 5,706,312
Date of Patent: Jan. 6, 1998

[54] TRELLIS CODED MODULATION EMPLOYING LOWER DIMENSIONALITY CONVOLUTIONAL ENCODER

[75] Inventor: Lee-Fang Wei, Lincroft, N.J.

[73] Assignee: Lucent Technologies Inc., Murray Hill, N.J.

[21] Appl. No.: 840,438

[22] Filed: Mar. 31, 1997

Related U.S. Application Data

[63] Continuation of Ser. No. 321,363, Oct. 11, 1994, abandoned.

[51] Int. Cl.$^6$ .............................. H04L 5/12; H03M 13/12
[52] U.S. Cl. .............................. 375/298; 375/265; 371/43
[58] Field of Search .............................. 375/262, 264, 375/265, 286, 295, 298, 340–341; 371/37.5, 37.8, 43

[56] References Cited

U.S. PATENT DOCUMENTS

| | | | |
|---|---|---|---|
| 4,660,214 | 4/1987 | Pahlavan et al. | 375/265 X |
| 4,941,154 | 7/1990 | Wei | 375/265 |
| 4,980,897 | 12/1990 | Decker et al. | 375/265 |
| 5,233,629 | 8/1993 | Pair et al. | 375/265 X |
| 5,248,646 | 9/1993 | Eyuboglu | 375/354 |
| 5,321,725 | 6/1994 | Pair et al. | 375/265 |
| 5,363,408 | 11/1994 | Pair et al. | 375/261 |
| 5,398,073 | 3/1995 | Wei | 348/487 |
| 5,442,626 | 8/1995 | Wei | 370/20 |

OTHER PUBLICATIONS

"Trellis–Coded Modulation with Multidimensional Constellations" IEEE Trans. on Info. Theory, vol. IT–33, No. 4, Jul. 1987, pp.483–501.

"Trellis–Coded Modulation with Redundant Signal Sets Part 1: Introduction, and IEEE Communications, Feb. 1987, vol. 25, No. 2 pp. 5–21 Part II State of the Art".

Primary Examiner—Young T. Tse
Attorney, Agent, or Firm—R. D. Slusky

[57] ABSTRACT

Coding gain is improved by employing an N-dimensional trellis encoder incorporating an N'-dimensional convolutional encoder where N' is less than N. The additional coding gain is realized as a shaping gain. This unique modulator encodes a digital signal by generating a sequence of N-dimensional symbols as a function of the digital signal using an N'-dimensional convolutional encoder within the trellis encoder more than once (integer N/N' times) during each N-dimensional symbol interval. This allows the trellis encoder to produce an output of higher dimensionality than would normally be expected from the lower dimensionality convolutional encoder. The trellis encoder is applicable to television transmission.

47 Claims, 6 Drawing Sheets

FIG. 4

| $Y9_n Y8_n Y7_n Y6_n Y5_n Y4_n$ | $Z2_n Z1_n$ | $Z2_{n+1} Z1_{n+1}$ | $Z2_{n+2} Z1_{n+2}$ | $Z2_{n+3} Z1_{n+3}$ |
|---|---|---|---|---|
| 0  | 00 | 00 | 00 | 00 |
| 1  | 00 | 00 | 00 | 10 |
| 2  | 00 | 00 | 01 | 00 |
| 3  | 00 | 00 | 01 | 10 |
| 4  | 00 | 10 | 00 | 00 |
| 5  | 00 | 10 | 00 | 10 |
| 6  | 00 | 10 | 01 | 00 |
| 7  | 00 | 10 | 01 | 10 |
| 8  | 11 | 00 | 00 | 00 |
| 9  | 11 | 00 | 00 | 10 |
| 10 | 11 | 00 | 01 | 00 |
| 11 | 11 | 00 | 01 | 10 |
| 12 | 11 | 10 | 00 | 00 |
| 13 | 11 | 10 | 00 | 10 |
| 14 | 11 | 10 | 01 | 00 |
| 15 | 11 | 10 | 01 | 10 |
| 16 | 22 | 00 | 00 | 00 |
| 17 | 22 | 00 | 00 | 10 |
| 18 | 22 | 00 | 01 | 00 |
| 19 | 22 | 00 | 01 | 10 |
| 20 | 00 | 22 | 00 | 00 |
| 21 | 00 | 22 | 00 | 10 |
| 22 | 00 | 22 | 01 | 00 |
| 23 | 00 | 22 | 01 | 10 |
| 24 | 00 | 01 | 22 | 00 |
| 25 | 00 | 10 | 22 | 00 |
| 26 | 01 | 00 | 22 | 00 |
| 27 | 10 | 00 | 22 | 00 |
| 28 | 00 | 00 | 00 | 22 |
| 29 | 00 | 01 | 00 | 22 |
| 30 | 01 | 00 | 00 | 22 |
| 31 | 10 | 00 | 00 | 22 |
| 32 | 22 | 11 | 00 | 00 |
| 33 | 22 | 11 | 00 | 10 |
| 34 | 22 | 11 | 01 | 00 |
| 35 | 22 | 11 | 01 | 10 |
| 36 | 11 | 22 | 00 | 00 |
| 37 | 11 | 22 | 00 | 10 |
| 38 | 11 | 22 | 01 | 00 |
| 39 | 11 | 22 | 01 | 10 |
| 40 | 00 | 01 | 22 | 11 |
| 41 | 00 | 10 | 22 | 11 |
| 42 | 01 | 00 | 22 | 11 |
| 43 | 10 | 00 | 22 | 11 |
| 44 | 00 | 00 | 11 | 22 |
| 45 | 00 | 01 | 11 | 22 |
| 46 | 01 | 00 | 11 | 22 |
| 47 | 10 | 00 | 11 | 22 |
| 48 | 22 | 00 | 22 | 01 |
| 49 | 22 | 00 | 20 | 12 |
| 50 | 22 | 00 | 20 | 21 |
| 51 | 22 | 00 | 12 | 22 |
| 52 | 00 | 22 | 22 | 01 |
| 53 | 00 | 22 | 20 | 12 |
| 54 | 00 | 22 | 20 | 21 |
| 55 | 00 | 22 | 12 | 22 |
| 56 | 22 | 11 | 02 | 20 |
| 57 | 22 | 11 | 02 | 20 |
| 58 | 11 | 22 | 02 | 20 |
| 59 | 11 | 22 | 02 | 20 |
| 60 | 22 | 22 | 00 | 01 |
| 61 | 22 | 22 | 01 | 02 |
| 62 | 02 | 21 | 22 | 22 |
| 63 | 01 | 10 | 22 | 22 |

BIT PATTERN: $Z2_m\ Z1_m\ Z0_m$
(m=n, n+1, n+2, n+3)

| LEGEND | |
|---|---|
| ⊕ | : EXCLUSIVE OR |
| 2T | : DELAY ELEMENT |
| T | : SIGNALING INTERVAL |

TRELLIS CODED MODULATION EMPLOYING LOWER DIMENSIONALITY CONVOLUTIONAL ENCODER

This application is a continuation of application Ser. No. 08/321,363, filed on Oct. 11, 1994, now abandoned.

TECHNICAL FIELD

This invention relates to trellis coded modulation and its application to television systems.

BACKGROUND OF THE INVENTION

Trellis coded modulation schemes have been shown to improve error performance of data links without sacrificing data rate or requiring additional bandwidth. Generally speaking, an N-dimensional trellis coded modulation scheme is constructed by first partitioning an N-dimensional constellation into a number of subsets. The input to the trellis coded modulation scheme in each N-dimensional symbol interval is divided into two portions. A first portion is input to an N-dimensional convolutional encoder whose output bits are used to identify an N-dimensional subset of the constellation. In this case, the convolutional encoder operates only once during each N-dimensional symbol interval. The second portion of input bits remains uncoded and is used to further specify an N-dimensional symbol from the identified N-dimensional subset. The bits identifying both the N-dimensional subset and the N-dimensional symbol are supplied to an N-dimensional constellation mapper. The constellation mapper converts the input bits into an N-dimensional symbol or J P-dimensional signal points, where J and P are integers whose product equals N.

In the prior art, the trellis coded modulation has a dimensionality which is equal to the dimensionality of its associated convolutional encoder. This is the generally accepted design in the art.

Trellis coded modulation has recently been recommended for use in high definition television (HDTV). In an approach proposed by Zenith Corporation to the FCC, the proposed modulation scheme utilizes a concatenated coded, vestigial sideband (VSB) modulator. In the concatenated coder, a Reed-Solomon code is used as an outer code followed by a one dimensional, four state trellis code as an inner code. The VSB modulator uses an eight symbol, one-dimensional constellation. For each successive transmission symbol period, the concatenated coder identifies a particular one of the eight one-dimensional VSB symbols to be transmitted. In this application to HDTV, the trellis coded modulation and its associated convolutional encoder have identical dimensionalities—both are one dimensional. Also, in allowed U.S. patent application Ser. No. 08/226,606, now U.S. Pat. No. 5,398,073 issued Mar. 14, 1995 and in U.S. patent application Ser. No. 08/276,079, higher-dimensional trellis coded modulators and convolutional encoders are used. But consistent with prior art practices, the dimension of the trellis coded modulator is equal to the dimension of its associated convolutional encoder.

SUMMARY OF THE INVENTION

Coding gain is improved in accordance with the principles of the present invention by employing an N-dimensional trellis coded modulator incorporating an N'-dimensional convolutional encoder where N' is less than N. The additional coding gain is realized as a shaping gain. This unique modulator encodes a digital signal by generating a sequence of N-dimensional symbols as a function of the digital signal using an N'-dimensional convolutional encoder within the trellis coded modulator more than once (integer N/N' times) during each N-dimensional symbol interval. This allows the trellis coded modulator to produce an output of higher dimensionality than would normally be expected from the lower dimensionality convolutional encoder.

In a specific embodiment of the invention, a two-dimensional (2D) convolutional code is used in a four-dimensional (4D) trellis coded modulation scheme. The trellis coded modulator uses four-dimensional constellation mapping.

In another embodiment, the N-dimensional trellis encoder is used as the inner coder of a concatenated code while an N-dimensional constellation mapper converts the coder output into a sequence of N-dimensional symbols or J P-dimensional signal points where J and P are integers whose product is N. Each P-dimensional signal point is transmitted in a so-called "signalling interval." J P-dimensional signal points are then transmitted in an N-dimensional symbol interval.

BRIEF DESCRIPTION OF THE DRAWINGS

A more complete understanding of the invention may be obtained by reading the following description of specific illustrative embodiments of the invention in conjunction with the appended drawing in which:

FIGS. 4 and 5 show details of a 4D constellation mapper for use with the 4D trellis coded modulator in FIG. 3.

DETAILED DESCRIPTION

Figure 1:
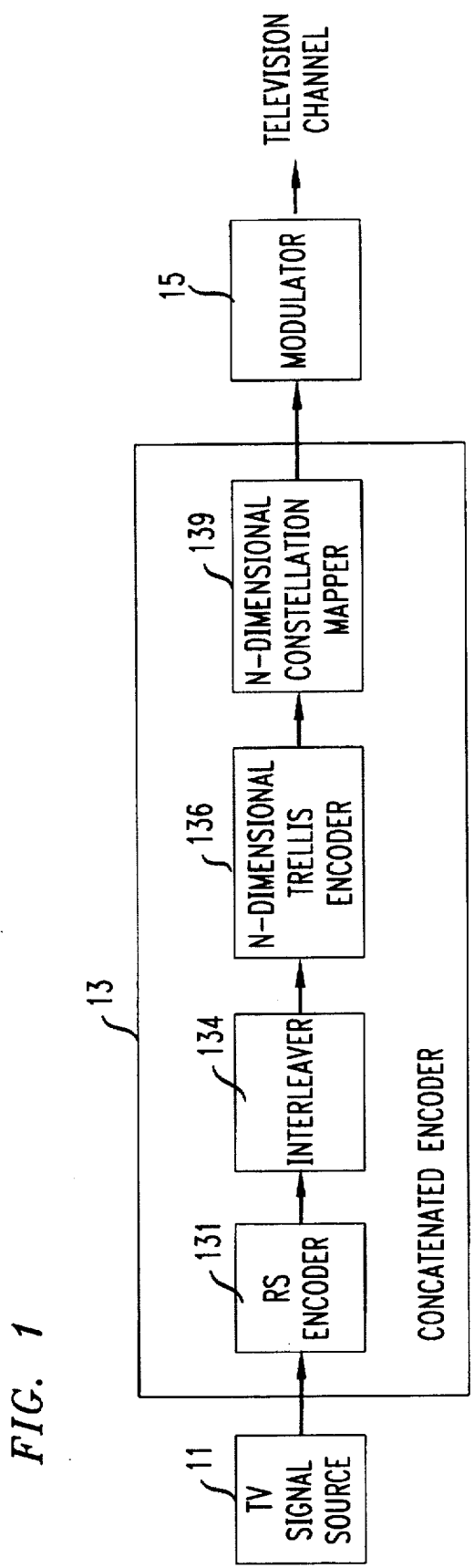
FIG. 1 is a block diagram of a television transmitter incorporating principles of the present invention.

FIG. 1 shows a block diagram of a television transmitter incorporating a trellis coded modulator realized in accordance with the principles of the present invention. The television transmitter includes TV signal source 11, concatenated encoder 13 and modulator 15.

A television signal such as an HDTV signal is supplied to the concatenated encoder by TV signal source 11. TV signal source 11 includes compression and formatting circuits as well as scrambling circuitry for rearranging the bit stream in a random order.

Figure 5:
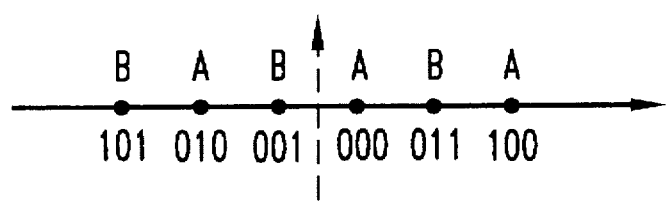

Concatenated encoder 13 includes the serial combination of Reed-Solomon encoder 131, interleaver 134, N-dimensional trellis encoder 136, and N-dimensional constellation mapper 139. Reed-Solomon encoder 131 is an outer encoder of the concatenated code while an N-dimensional trellis encoder 136 is the inner encoder of concatenated encoder 13. Interleaver 134 operates in a conventional manner to reorder the sequence of Reed-Solomon symbols from encoder 131 thereby providing burst error protection in the receiver. Trellis encoder 136 generates output bits which identify a symbol in an N-dimensional constellation in each N-dimensional symbol interval. It is contemplated that an N-dimensional symbol be transmitted as a sequence of J P-dimensional signal points where J and P are integers whose product is N. N-dimensional constellation mapper 139 converts the modulator output into a specific N-dimensional symbol or sequence of J P-dimensional signal points according to a prescribed set of mapping rules. One such set of rules is shown in FIGS. 4 and 5.

Symbols output by concatenated encoder 13 are supplied to modulator 15 for transmission over the television channel. While many modulation schemes are applicable to modulator 15, quadrature amplitude modulation (QAM) and the vestigial sideband modulation (VSB) are presently the modulation techniques of choice for HDTV application. It should be noted that the input to an M-ary VSB modulator is a sequence of one-dimensional (P=1) signal points whereas the input to a QAM modulator is a sequence of two-dimensional (P=2) signal points. In the description which follows, it will be assumed that modulator 15 is an M-VSB modulator. The symbol "M" indicates that the amplitude of the VSB signal can assume any one of M different values. As such, M is the size of the one-dimensional transmitter constellation implemented by the modulator.

Modulator 15 not only includes standard modulation circuitry, but also includes an interleaver for rearranging the sequence of signal points in such a way that successive signal points generated by concatenated encoder 13 will not appear in succession on the television channel. This additional interleaving insures optimal performance of the convolutional decoder described below. Modulator 15 may also include a Tomlinson precoder as discussed in U.S. patent application Ser. No. 08/276,079, whose teachings are expressly incorporated herein by reference.

Figure 2:
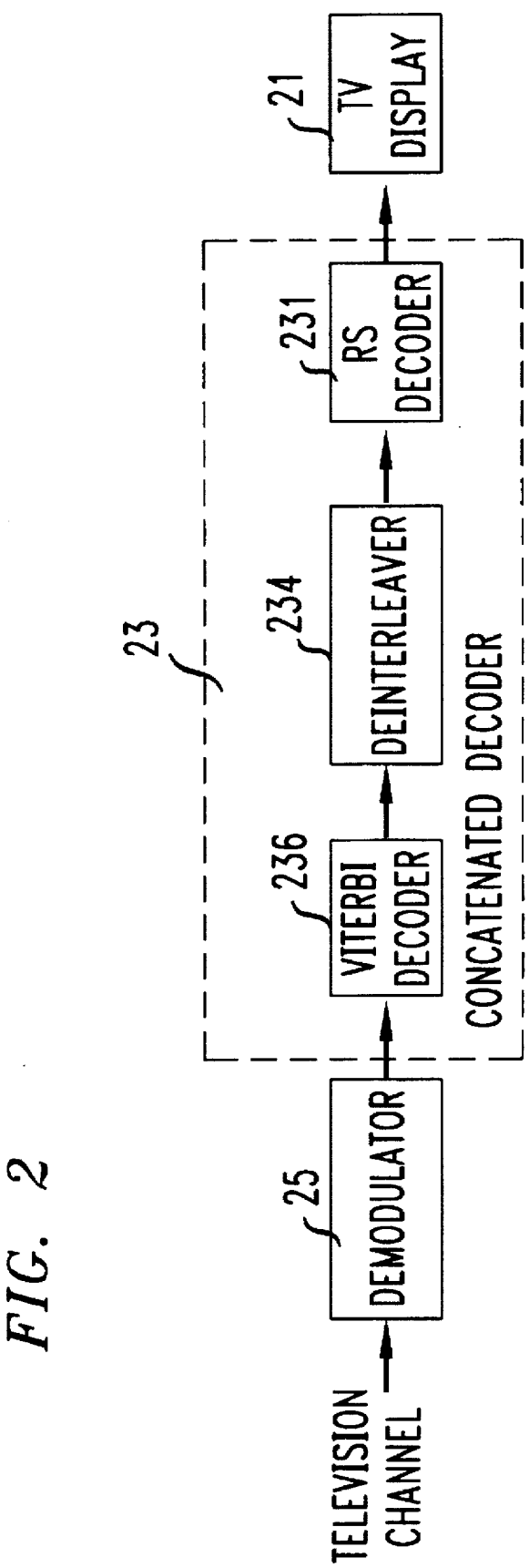
FIG. 2 is a block diagram of a television receiver incorporating principles of the present invention.

Signals output by modulator 15 are applied to a television channel. Exemplary television channels are cable or an over-the-air channel. Signals on a television channel are received by the receiver shown in FIG. 2.

The received signal is applied to demodulator 25. Demodulator 25 performs the inverse operation of each component in modulator 15. For example, demodulator 25 may include a VSB demodulator, an NTSC rejection filter, a channel equalizer, and a de-interleaver. The latter element is used to restore signal points to their original order for subsequent decoding.

The output of demodulator 25 is applied to concatenated decoder 23. Concatenated decoder 23 includes Viterbi decoder 236, de-interleaver 234, and Reed-Solomon decoder 231. Viterbi decoder 236 performs convolutional decoding by the well-known Viterbi decoding technique. The output of decoder 236 is a sequence of interleaved Reed-Solomon symbols. Those symbols are restored to their original order by de-interleaver 234, which performs the inverse operation of interleaver 134. Once in the proper order, the symbols are decoded by Reed-Solomon decoder 231. TV display 21 receives the output of Reed-Solomon decoder 231. The display includes standard circuitry for decompressing (expanding) and reformatting the television signal for presentation on a CRT or other suitable viewing screen.

In the context of the present invention, it will be appreciated by persons skilled in the art that the Viterbi decoder has the same dimensionality as the convolutional encoder in the trellis code modulator. That is, the Viterbi decoder is N' dimensional. This means that the Viterbi decoder, during each processing cycle, processes an N' dimensional input. If the receiver receives P-dimensional inputs, then a sufficient number of those P-dimensional inputs are concatenated to form the N'-dimensional input to the Viterbi decoder. The bits output by the Viterbi decoder are collected over an entire symbol interval and together are mapped into the bits that correspond to the input to the trellis encoder during the associated N-dimensional symbol interval.

It will be understood by those skilled in the art, although not explicitly shown or described herein, synchronization signals are periodically inserted by modulator 15 into the data stream it receives from concatenated encoder 13. Demodulator 25 recognizes the synchronization signals and responsively generates synchronization control signal which is used by the television receiver to synchronize receiver operations, where necessary, with corresponding transmitter operations.

In various illustrative embodiments, the Reed-Solomon encoder utilizes a so-called RS(208,188) code over GF(256). This means that each Reed-Solomon codeword has 188 data symbols and 20 redundant symbols where each symbol consists of 8 bits. Depending on the degradation of transmission on a television channel, more-or less-powerful Reed-Solomon codes can be selected by balancing the need for a particular error-correcting capability against the need for a particular bit rate.

Figure 3:
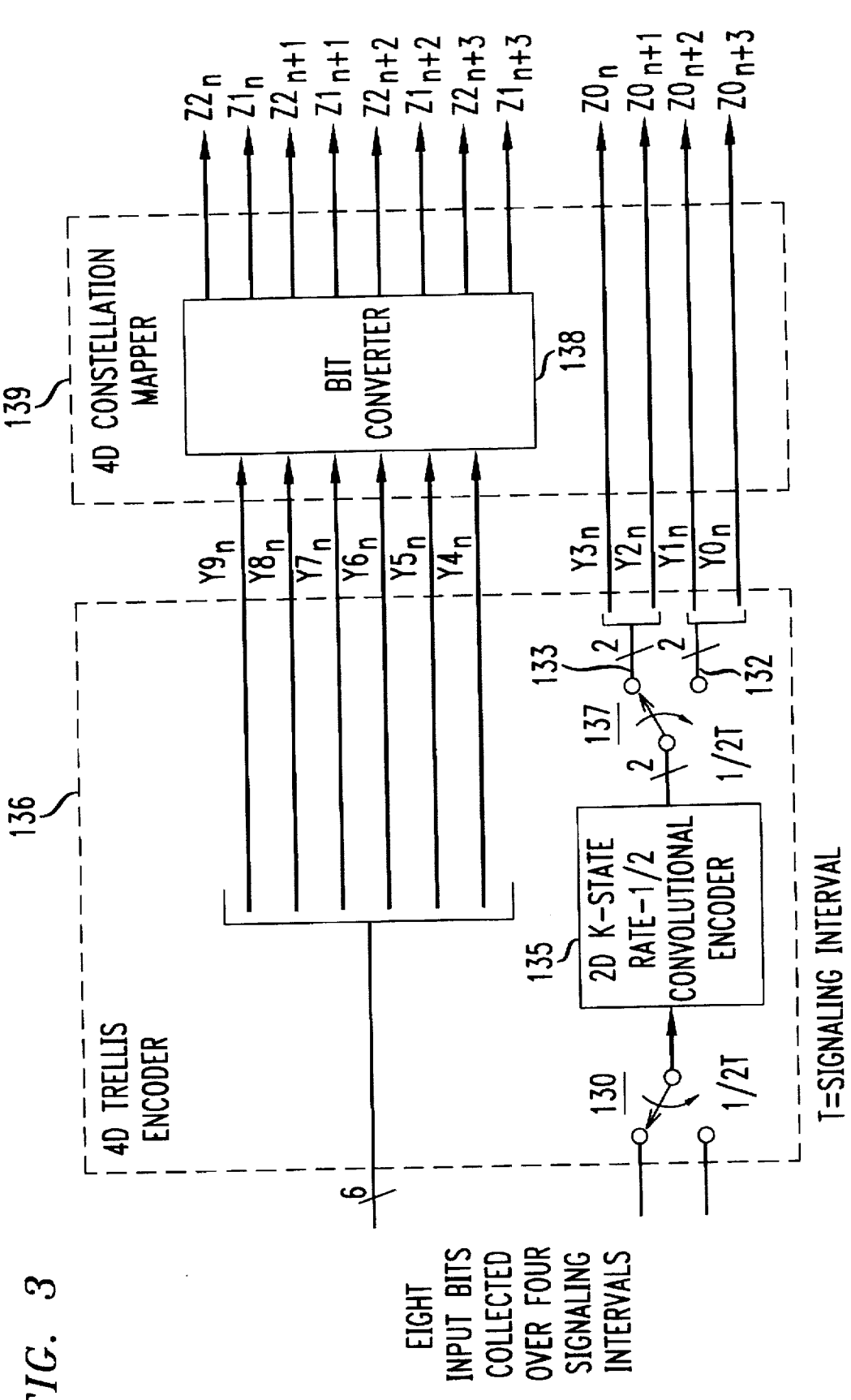
FIG. 3 shows a specific implementation of a 4D trellis coded modulator employing a 2D convolutional encoder.

An exemplary 4-dimensional trellis code modulator using a 6-VSB transmitter constellation realized in accordance with the principles of the invention is shown in FIGS. 3–5. In this exemplary embodiment, the trellis encoder is four-dimensional owing to the fact that its associated constellation mapper is four-dimensional and the convolutional encoder within the trellis code modulator is two-dimensional. In this FIG, the notation drawing a slash through a line and placing a number x above the slash is meant to indicate that there are x such input or output leads having the connections of the single line shown in the FIG.

Convolutional encoder 135 utilizes a 2D, K state, rate ½ convolutional code in this example. This encoder accepts one input bit in each pair of signalling intervals and produces two output bits. Since the input bits to trellis encoder 136 are actually collected over four signalling intervals in this example and because this creates two input bits for the convolutional encoder to handle, it is necessary to encode the bits sequentially and thereby produce the four output bits.

In the example depicted in FIG. 3, it is assumed that a first input bit supplied to the convolutional encoder during a symbol interval is collected during its (the symbol interval's) first pair of signalling intervals. Similarly, a second input bit supplied to the convolutional encoder during the same symbol interval is collected during its second pair of signalling intervals.

To this end, the convolutional encoder is augmented by elements 130 and 137, each shown schematically as a switch. Element 130 applies one of the available input bits to the encoder during the first pair of signalling intervals of a symbol interval. In the second pair of signalling intervals of the symbol interval, element 130 applies the second input bit to the convolutional encoder. Element 137 directs the output bits during one convolutional encoding cycle to output lead 133 and then switches the output during the next convolutional encoding cycle to output lead 132. The switching rate for elements 130 and 137 is denoted as 1/2T, where T is the signalling interval.

Constellation mapper 139 includes bit converter 138 and a plurality of straight-through connections. In this example, the outputs of convolutional encoder 135 are fed straight-through constellation mapper 139 to its output. Uncoded bits from trellis encoder 136 are supplied to bit converter 138. As shown in FIG. 3, bit converter 138 translates its six-bit input into an eight-bit output. Bit converter 138 insures that each output bit is derived jointly and interdependently from the input bits. The output bits from constellation mapper 139 are then used to select a four-dimensional symbol or a sequence of four one-dimensional signal points from a 6-VSB transmitter constellation over the four signalling intervals identified in the subscripts as n, n+1, n+2, and n+3.

Operational and realization details of both the convolutional encoder and the bit converter shown in FIG. 3 are well known to persons skilled in this art and, as such, they will not be described further herein.

Each of the sixteen different possible bit patterns represented by the four bits output in each symbol interval from trellis encoder 136 identifies a respective subset of symbols of a four-dimensional constellation. The remaining six bits, so-called "uncoded," bits $Y4_n$ through $Y9_n$ further select a particular symbol from the identified four-dimensional subset.

In particular, the 4D constellation is formed by concatenating four 6-VSB 1D transmitter constellations. The 4D constellation is partitioned into sixteen four dimensional subsets based on a partitioning of its constituent one-dimensional transmitter constellations. FIG. 5 shows how the one-dimensional six-point VSB constellation is partitioned into two subsets, A and B, each subset having three one-dimensional signal points. Each 4D subset is simply a sequence of four 1D subsets. In addition, each 4D subset may be represented as a sequence of two 2D subsets. In the latter case, each 2D subset is merely a sequence of two 1D subsets.

The selection of a particular symbol from the identified four-dimensional subset proceeds as follows: The four bits $Y3_n$, $Y2_n$, $Y1_n$, and $Y0_n$, from convolutional encoder 135 are output by the constellation mapper as four bits, $Z0_n$, $Z0_{n+1}$, $Z0_{n+2}$, and $Z0_{n+3}$, respectively. These bits are then used to select the sequence of one-dimensional subsets which the bits identify.

There are actually 81 possible symbols in each one-dimensional subset sequence, as can be seen from the fact that each one-dimensional subset has three signal points, and $3^4=81$. However, since the six bits $Y4_n$ through $Y9_n$ can represent only 64 different bit patterns, not all of the 81 symbols will actually be used. Rather, it is advantageous for the lookup table of FIG. 4 to map the 64 input bit patterns into the 64 symbols sharing a common characteristic. For example, the symbols may be the smallest energy symbols (the energy of a symbol being simply given by the sum of the squares of the coordinates of its constituent one-dimensional signal points.) To this end, bits $Y4_n$ through $Y9_n$ are applied to bit converter 138 which implements the lookup table shown in FIG. 4. The first pair of output bits of bit converter 138—denoted $Z2_n$ and $Z1_n$—selects a signal point from the first subset of the one-dimensional subset sequence, which is identified by bit $Z0_n$. The second pair of output bits of encoder 138—denoted $Z2_{n+1}$ and $Z1_{n+1}$— selects a signal point from the second subset of the one-dimensional subset sequence, which is identified by bit $Z0_{n+1}$, and so forth. FIG. 5 shows the mapping by which the bit values of $Z2_m$, $Z1_m$, and $Z0_m$, for m=n, n+1, n+2 and n+3 identify a particular one-dimensional signal point.

Figure 6:
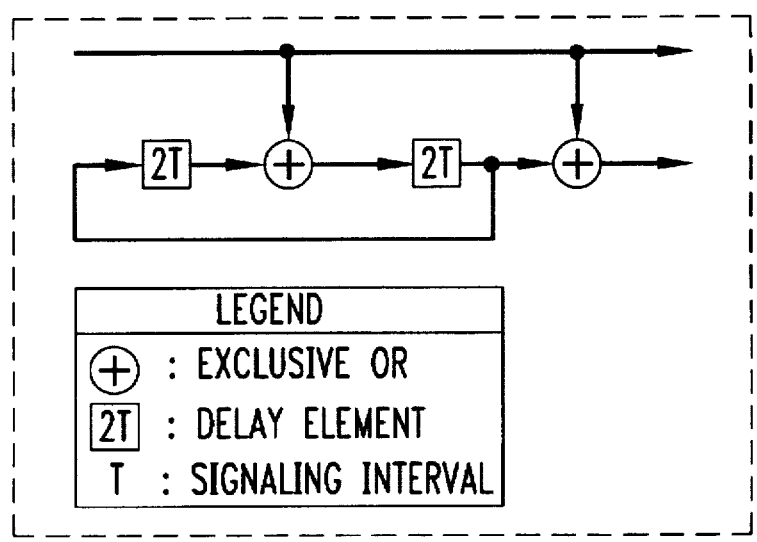
FIGS. 6–10 show specific 2D, rate ½ convolutional encoders.
Figure 7:
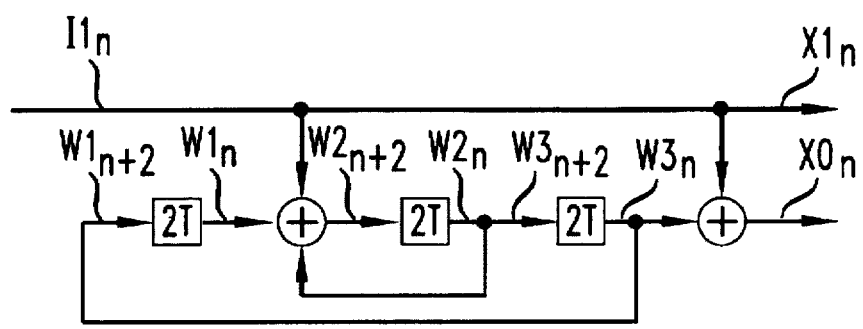
Figure 8:
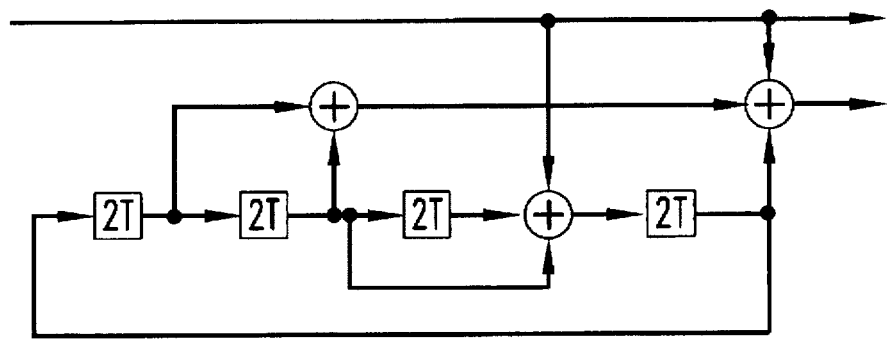
Figure 9:
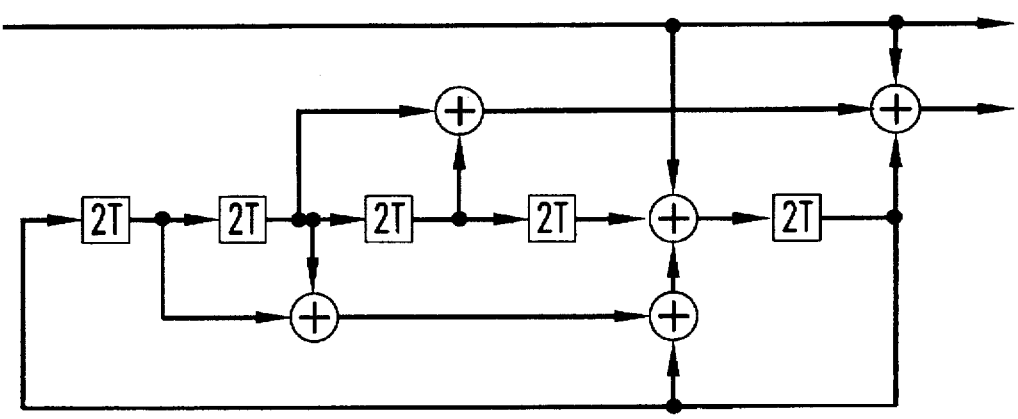
Figure 10:
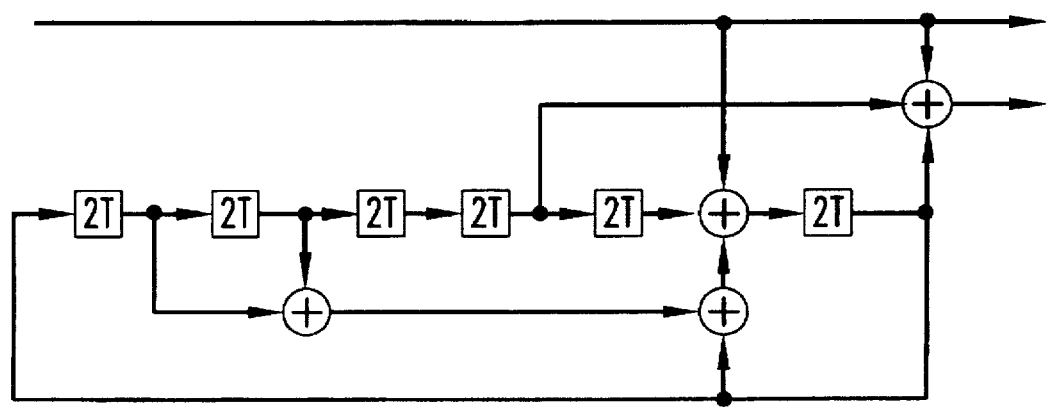

Examples of 2D, rate ½, K-state convolutional encoders suitable for use as encoder 135 are shown in FIG. 6 (K=4), FIG. 7 (K=8), FIG. 8 (K=16), FIG. 9 (K=32), and FIG. 10 (K=64). These encoders are useful as the convolutional encoder for trellis code modulator 136 in FIG. 3.

Specifically, the operations of the convolutional encoder in FIG. 7 can be explicitly described as follows. In each pair of signalling intervals, designated by the index "n" for its first signalling interval, the encoder inputs a bit $I1_n$, makes a transition from its current state, $W1_n$, $W2_n$, $W3_n$, to a next state, $W1_{n+2}$, $W2_{n+2}$, $W3_{n+2}$, and outputs two bits $X1_n$, and $X0_n$, where $W1_n$, $W2_n$ and $W3_n$ are the bits stored in the delay elements at the beginning of the pair of signalling intervals, and $W1_{n+2}$, $W2_{n+2}$ and $W3_{n+2}$ are the bits stored in the delay elements at the end of the pair of signalling intervals, and $X1_n = I1_n$ $X0_n = W3_n \oplus X1n$ $W1_{n+2} = W3_n$ $W2_{n+2} = W1_n \oplus W2n \oplus I1n$ $W3_{n+2} = W2_n$ Each convolutional code shown in FIGS. 6–10 is designed to maximize the minimum Hamming distance between the sequences of its encoded output bits. Trellis encoders employing these convolutional codes are desirable when concatenated with Reed-Solomon codes, for example. While the Hamming distance feature of the depicted codes is desirable in certain cases, there may be other features such as rotational invariance and the like which may be desirable for the convolutional codes. In any of the cases cited above, it is important to understand that, regardless of the features are selected for the code, the convolutional code must have a lower dimensionality than that of its associated trellis code modulator.

Other state sizes can be used for the convolutional encoder 135 of FIG. 3. Although the exemplary codes are shown as s systematic codes, it is understood that non-systematic codes are equally applicable to the present invention.

It is contemplated that rates other than ½, dimensions other than 2, and other various state sizes can be employed in the convolutional encoder used by trellis encoder 136.

In the example described above, VSB constellations have been employed causing P to be equal to 1. As such, each 4D symbol was constructed as a sequence of four 1D signal points. It should be understood that each 4D symbol could also be represented as a sequence of two 2D signal points. In the 6-VSB example, each 2D signal point can be represented as a sequence of two 1D signal points. At the receiver, the Viterbi decoder will process one such 2D point in each processing cycle.

As stated earlier, the present invention is applicable to other modulation systems such as QAM, for example. For the specific example described above, the 4D trellis code modulator will output a pair of 2D signal points in each symbol interval.

In the description above, the invention has been described in the context of integer bit rates. That is, the average number of input bits received in each symbol interval is an integer. In practice, however, it is understood that cases arise wherein the average number of input bits received in each symbol interval is a non-integer. For such cases, it is contemplated that the input to the trellis encoder will be adapted with a fractional bit encoder (not shown) to insure that an integer number of input bits is received by the trellis encoder in each symbol interval, as described in U.S. Pat. No. 4,941,154.

I claim:

1. A method of N-dimensional trellis coded modulation for encoding a digital signal, the method comprising the step of:

generating a sequence of N-dimensional symbols as a function of the digital signal using an N'-dimensional convolutional encoder, where $N>N'\geq 1$, said encoder being used to generate for each of a plurality of N-dimensional signal intervals, a plurality of groups of outputs, each said group of outputs being a function of a respective different group of inputs, the N-dimensional symbols comprising J P-dimensional signal points and the digital signal having an integer number of bits per each P-dimensional signal point.

2. The method as defined in claim 1 wherein for each N-dimensional signaling interval, the digital signal is arranged into first and second portions and said first portion is divided into (N/N') groups of bits, the step of generating further including the steps of:

applying each of said groups of bits sequentially to the N'-dimensional convolutional encoder;

using output bits from convolutional encoding of all groups of bits included in said first portion to identify an N-dimensional subset of an N-dimensional constellation; and using said second portion to specify, jointly and interdependently, the J signal points of an N-dimensional symbol from the N-dimensional subset.

3. The method as defined in claim 2 wherein said subset of said N-dimensional constellation consists of a sequence of (N/N') N'-dimensional subsets, wherein each N'-dimensional subset is identified by the convolutional encoder output for a particular group of bits.

4. A method of concatenated encoding a digital signal, the method comprising the steps of:

Reed-Solomon encoding the digital signal;

generating a sequence of N-dimensional symbols as a function of the Reed-Solomon encoded signal using an N'-dimensional convolutional encoder, said encoder including a finite state machine which advances multiple states for each of a plurality of hi-dimensional signaling intervals, where $N>N'\geq 1$, the N-dimensional symbols comprising J P-dimensional signal points and the Reed-Solomon encoded signal having an integer number of bits per each P-dimensional signal point.

5. The method as defined in claim 4 wherein the step of generating symbols includes the step of interleaving the Reed-Solomon encoded signal.

6. A method of transmitting a digital signal over a television channel, the method comprising the steps of:

Reed-Solomon encoding the digital signal;

generating a sequence of N-dimensional symbols as a function of the Reed-Solomon encoded signal using an N'-dimensional convolutional code within an N-dimensional trellis code, where $N>N'\geq 1$, said convolutional code being used to generate for each of a plurality of N-dimensional signaling intervals a plurality of groups of outputs each said group of outputs being a function of a respective different group of inputs;

representing each of said symbols as a sequence of J P-dimensional signal points of a P-dimensional M-ary transmitter constellation, where $J\times P=N$ and the number of bits in the Reed-Solomon encoded digital signal per each P-dimensional signal point is integral;

generating a modulated signal which represents the resulting sequence of signal point representations; and applying said modulated signal to said television channel.

7. The method as defined in claim 6 wherein the step of generating symbols includes the steps of interleaving the Reed-Solomon encoded signal and trellis encoding the resulting interleaved signal.

8. The method as defined in claim 6 wherein the trellis code is a four-dimensional trellis code and the convolutional code is a two-dimensional convolutional code.

9. The method as defined in claim 8 wherein the convolutional code is a K-state, rate ½ code and K is selected from the group consisting of 4, 8, 16, 32, and 64.

10. The method as defined in claim 6 wherein the television channel is an over-the-air channel and wherein P equals 1.

11. The method as defined in claim 10 wherein the trellis code is a four dimensional trellis code and the convolutional code is a two-dimensional convolutional code.

12. The method as defined in claim 11 wherein the convolutional code is a K-state, rate ½ code and K is selected from the group consisting of 4, 8, 16, 32, and 64.

13. The method as defined in claim 6 wherein the television channel is an over-the-air channel and wherein P equals 2.

14. The method as defined in claim 13 wherein the trellis code is a four dimensional trellis code and the convolutional codeis a two-dimensional convolutional code.

15. The method as defined in claim 14 wherein the convolutional code is a K-state, rate ½ code and K is selected from the group consisting of 4, 8, 16, 32, and 64.

16. An N-dimensional trellis coded modulator comprising means for receiving a digital signal, and an N'-dimensional convolutional encoder for generating a sequence of N-dimensional symbols as a function of the digital signal, where $N>N'\geq 1$, said encoder including a finite state machine which advances multiple states for each of a plurality of N-dimensional signaling intervals, the N-dimensional symbols comprising J P-dimensional signal points and the digital signal having an integer number of bits per each P-dimensional signal point.

17. The modulator as defined in claim 16 wherein for each N-dimensional signaling interval, the digital signal is arranged into first and second portions and said first portion is divided into (N/N') groups of bits, wherein the modulator further includes:

means for applying each of said groups of bits sequentially to the N'-dimensional convolutional encoder;

means responsive to output bits from convolutional encoding of all groups of bits included in said first portion for identifying an N-dimensional subset of an N-dimensional constellation; and means responsive to said second portion for specifying, jointly and interdependently, the J signal points of an N-dimensional symbol from the N-dimensional subset.

18. The modulator as defined in claim 17 wherein said subset of said N-dimensional constellation consists of a sequence of (N/N')N'-dimensional subsets, wherein each N'-dimensional subset is identified by the convolutional encoder output for a particular group of bits.

19. Apparatus for concatenated encoding a digital signal, the apparatus comprising:

means for Reed-Solomon encoding the digital signal, and means for generating a sequence of N-dimensional symbols as a function of the Reed-Solomon encoded signal using an N'-dimensional convolutional encoder, said encoder being used to generate for each N-dimensional signaling interval a plurality of groups of outputs, each said group of outputs being a function of a respective different group of inputs, where $N>N'\geq 1$, the N-dimensional symbols comprising J P-dimensional signal points and the Reed-Solomon encoded signal having an integer number of bits per each P-dimensional signal point.

20. The apparatus as defined in claim 19 wherein the means for generating symbols includes means for interleaving the Reed-Solomon encoded signal.

21. Apparatus for transmitting a digital signal over a television channel, the apparatus comprising:

means for Reed-Solomon encoding the digital signal;

means for generating a sequence of N-dimensional symbols as a function of the Reed-Solomon encoded signal using an N'-dimensional convolutional encoder within an N-dimensional trellis encoder, said convolutional coder including a finite state machine which advances multiple states for each of a plurality of N-dimensional signaling intervals, where N>N'≧1;

means for representing each of said symbols as a sequence of J P-dimensional signal points of a P-dimensional M-ary transmitter constellation, where J×P=N and the number of bits in the Reed-Solomon encoded digital signal per each P-dimensional signal point is integral;

means for generating a modulated signal which represents the resulting sequence of signal point representations; and means for applying said modulated signal to said television channel.

22. The apparatus as defined in claim 21 wherein means for generating symbols includes means for interleaving the Reed-Solomon encoded signal and means for trellis encoding the resulting interleaved signal.

23. The apparatus as defined in claim 21 wherein the trellis encoder is a four-dimensional trellis encoder and the convolutional encoder is a two-dimensional convolutional encoder.

24. The apparatus as defined in claim 23 wherein the convolutional encoder is a K-state, rate ½ encoder and K is selected from the group consisting of 4, 8, 16, 32, and 64.

25. The apparatus as defined in claim 21 wherein the television channel is an over-the-air channel and wherein P is equal to 1.

26. The apparatus as defined in claim 25 wherein the trellis encoder is a four dimensional trellis encoder and the convolutional encoder is a two-dimensional convolutional encoder.

27. The apparatus as defined in claim 26 wherein the convolutional encoder is a K-state, rate ½ encoder and K is selected from the group consisting of 4, 8, 16, 32, and 64.

28. The apparatus as defined in claim 21 wherein the television channel is an over-the-air channel and wherein P is equal to 2.

29. The apparatus as defined in claim 28 wherein the trellis encoder is a four dimensional trellis encoder and the convolutional encoder is a two-dimensional convolutional encoder.

30. The apparatus as defined in claim 29 wherein the convolutional encoder is a K-state, rate ½ code and K is selected from the group consisting of 4, 8, 16, 32, and 64.

31. A method of processing a signal from a communication channel, said signal having been generated by encoding a digital signal using N-dimensional trellis coded modulation, wherein the encoding comprised the step of generating a sequence of N-dimensional symbols as a function of the digital signal using an N'-dimensional convolutional encoder, said encoder including a finite state machine which advances multiple states for each of a plurality of N-dimensional signaling intervals, where N>N'≧1, the N-dimensional symbols comprising J P-dimensional signal points and the digital signal having an integer number of bits per each P-dimensional signal point, the method including the steps of:

receiving said signal from said communication channel, and recovering said digital signal from said received communication channel signal.

32. The method as defined in claim 31 wherein the recovering step includes the steps of:

demodulating said received communication channel signal to generate a demodulated signal;

processing the demodulated signal to recover said digital signal.

33. The method as defined in claim 32 wherein the processing step includes the step of Viterbi decoding said demodulated signal by using an N'-dimensional Viterbi decoder.

34. The method as defined in any one of claims 31 through 33 wherein for each N-dimensional signaling interval, the digital signal is arranged into first and second portions and said first portion is divided into (N/N') groups of bits, the step of generating said sequence of N-dimensional symbols further included the steps of:

applying each of said groups of bits sequentially to the N'-dimensional convolutional encoder;

using output bits from convolutional encoding of all groups of bits included in said first portion to identify an N-dimensional subset of an N-dimensional constellation; and using said second portion to specify, jointly and interdependently, the J signal points of an N-dimensional symbol from the N-dimensional subset.

35. A method of processing a signal from a television channel, said signal having been generated by Reed-Solomon encoding a digital signal, generating a sequence of N-dimensional symbols as a function of the Reed-Solomon encoded signal using an N'-dimensional convolutional encoder within an N-dimensional trellis encoder, said convolutional coder including a finite state machine which advances multiple states for each N-dimensional symbol interval, where N>N'≧1, representing each of said symbols as a sequence of J P-dimensional signal points of a P-dimensional M-ary transmitter constellation, where J×P=N and the number of bits in the Reed-Solomon encoded digital signal per each P-dimensional signal point is integral, generating a modulated signal which represents the resulting sequence of signal point representations, and applying said modulated signal to said television channel, the method including the steps of:

receiving said signal from said television channel, and recovering said digital signal from said received television channel signal.

36. The method as defined in claim 35 wherein the trellis encoder is a four-dimensional trellis encoder and the convolutional encoder is a two-dimensional convolutional encoder.

37. The method as defined in claim 36 wherein the convolutional encoder is a K-state, rate ½ encoder and K is selected from the group consisting of 4, 8, 16, 32, and 64.

38. The method as defined in claim 35 wherein the television channel is an over-the-air channel and wherein P equals 1.

39. The method as defined in claim 38 wherein the trellis encoder is a four dimensional trellis encoder and the convolutional encoder is a two-dimensional convolutional encoder.

40. The method as defined in claim 39 wherein the convolutional encoder is a K-state, rate ½ encoder and K is selected from the group consisting of 4, 8, 16, 32, and 64.

41. The method as defined in claim 35 wherein the television channel is an over-the-air channel and wherein P equals 2.

42. The method as defined in claim 41 wherein the trellis encoder is a four dimensional trellis encoder and the convolutional encoder is a two-dimensional convolutional encoder.

43. The method as defined in claim 42 wherein the convolutional encoder is a K-state, rate ½ encoder and K is selected from the group consisting of 4, 8, 16, 32, and 64.

44. A method of processing a signal from a communication channel, said signal having been generated by concatenated encoding a digital signal using N-dimensional trellis coded modulation, wherein the encoding comprised the steps of Reed-Solomon encoding the digital signal and generating a sequence of N-dimensional symbols as a function of the Reed-Solomon encoded signal using an N'-dimensional convolutional encoder, where $N>N'\geq 1$, said encoder being used to generate for each N-dimensional symbol interval a plurality of groups of outputs, each said group of outputs being a function of a respective different group of inputs, the N-dimensional symbols comprising J P-dimensional signal points and the Reed-Solomon encoded signal having an integer number of bits per each P-dimensional signal point, the method including the steps of:

receiving said signal from said communication channel, and recovering said digital signal from said received communication channel signal.

45. The method as defined in any one of claims 34–36 wherein for each N-dimensional signaling interval, the Reed-Solomon encoded signal is arranged into first and second portions and said first portion is divided into (N/N') groups of bits, the step of generating further including the steps of:

applying each of said groups of bits sequentially to the N'-dimensional convolutional encoder;

using output bits from convolutional encoding of all groups of bits included in said first portion to identify an N-dimensional subset of an N-dimensional constellation; and using said second portion to specify, jointly and interdependently, the J signal points of an N-dimensional symbol from the N-dimensional subset.

46. The invention as defined in any one of claims 4, 16, 21, 31 or 35, wherein said finite state machine that advances N/N' states for each of the plurality of N-dimensional signaling intervals.

47. The invention as defined in any one of claims 1, 6, 19 or 34, wherein said plurality of groups of outputs is comprised of N/N' groups of outputs and said respective different group of inputs is one of N/N' groups of inputs.

* * * * *

UNITED STATES PATENT AND TRADEMARK OFFICE
CERTIFICATE OF CORRECTION

PATENT NO. : 5,706,312
DATED : January 6, 1998
INVENTOR(S) : Lee-Fang Wei

It is certified that error appears in the above-identified patent and that said Letters Patent is hereby corrected as shown below:

Column 7, line 35, change "hi-dimensional" to --N-dimensional--.
          line 52, change "outputs each" to --outputs, each--.
Column 9, line 28, change "means for generating symbols" to --the means for generating symbols--.
Column 12, line 5, change "34-36" to --35, 36, or 44--.
          line 25, change "34" to --44--.

Signed and Sealed this

Eighth Day of June, 1999

Attest:

Attesting Officer

Q. TODD DICKINSON

Acting Commissioner of Patents and Trademarks